United States Patent [19]
Gilmour et al.

[11] Patent Number: 5,391,917
[45] Date of Patent: Feb. 21, 1995

[54] MULTIPROCESSOR MODULE PACKAGING

[75] Inventors: Richard J. Gilmour, Liberty Hill; Gustav Schrottke, Austin, both of Tex.

[73] Assignee: International Business Machines Corporation, Armonk, N.Y.

[21] Appl. No.: 58,892

[22] Filed: May 10, 1993

[51] Int. Cl.6 .................. H01L 23/525; H01L 23/538
[52] U.S. Cl. .................... 257/690; 257/777; 257/778; 257/724
[58] Field of Search ............ 257/690, 723, 666, 724, 257/777, 778

[56] References Cited

U.S. PATENT DOCUMENTS

| | | | |
|---|---|---|---|
| 3,787,252 | 1/1974 | Filippazzi et al. | 148/175 |
| 4,229,755 | 10/1980 | Custode | 357/41 |
| 4,507,845 | 4/1985 | McIver et al. | 29/571 |
| 4,587,711 | 5/1986 | Godejahn, Jr. | 29/571 |
| 4,897,708 | 1/1990 | Clements | 257/690 |
| 4,939,568 | 7/1990 | Kato et al. | 257/723 |
| 4,956,695 | 9/1990 | Robinson et al. | 357/74 |
| 4,989,063 | 1/1991 | Kolesar, Jr. | 357/54 |
| 5,024,966 | 6/1991 | Dietrich et al. | 437/60 |
| 5,039,628 | 8/1991 | Carey | 487/183 |
| 5,063,177 | 11/1991 | Geller et al. | 437/209 |
| 5,266,833 | 11/1993 | Capps | 257/690 |

FOREIGN PATENT DOCUMENTS

| | | | |
|---|---|---|---|
| 3233195 | 3/1983 | Germany | 257/723 |
| 0098655 | 6/1985 | Japan | 257/723 |
| 0281753 | 11/1990 | Japan | 257/723 |

OTHER PUBLICATIONS

IBM TDB, "Solder Bonding of Silicon Chips with Through Holes", vol. 18, No. 10, Mar. 1976, p. 3478.

Primary Examiner—Rolf Hille
Assistant Examiner—Peter Toby Brown
Attorney, Agent, or Firm—Mark E. McBurney

[57] ABSTRACT

A function module using technology which allows conductive vias to be formed in a silicon substrate in order to fabricate three dimensional multifunctional processor system is described. A silicon or other semiconductor carrier having embedded active devices therein is used as a substrate for complex functional elements disposed on both sides thereof. The semiconductor substrate includes conductive vias formed therein which interconnect single chips or multichip modules disposed on either side thereof. Using drilling/plating techniques for wafer substrates electrically interconnected devices are placed on opposite sides of the substrate. Multichip modules (MCM) including the desired functions are then fabricated having input/output (I/Os) connection points which correspond to the vias formed in the substrate. This interconnection between the MCMs and the substrate may be accomplished by providing circuitized lines and connection pads on a dielectric layer, with conductive vias therein, which is subsequently placed on the active substrate. A dielectric layer having circuitized lines therein can then be extended outwardly from the module in order to provide electrical connection to input output devices, e.g. keyboard, display, or the like, as well as other system components, such as like multifunctional elements.

2 Claims, 4 Drawing Sheets

MULTIPROCESSOR MODULE PACKAGING

BACKGROUND OF THE INVENTION

1. Field of the Invention

The present invention relates to a tightly coupled multiprocessor system fabricated using a silicon wafer integral to a three dimensional assembly. More particularly, unpackaged integrated circuit devices, such as logic and memory chips are disposed on a wafer and connected to electronic devices therein to form a multifunctional module, which can be used to form a multiprocessor computer system.

2. Description of Related Art

Conventionally, multiprocessor systems utilize separate and distinct functional units, such as a multichip module with a substrate carrier for the processors, a memory adapter card, e.g. single in line memory module (SIMM), and a separate module for a switching element which allows the processors to communicate with the memory.

These discrete functional units each require a substantial amount of volume in a computer system and also present data transmission problems, since at least some of the interconnecting lines will be long, increasing time of flight of data to levels not commensurate with performance requirements of the machine. Alternatively, a processor placed on one side of a card, away from the memory unit, will have longer line lengths to a memory chip than those of a processor mounted near the memory. In order to prevent data timing skew associated with these variations in line length, all of the critical wiring paths in conventional systems are designed to be the same length. Thus, the line length is dependent on the length of the longest line and hence system performance suffers.

Multichip modules, which are known in the art, allow whole computer functions to be placed on a single module, which can in turn be attached to a computer planar, by a connector, or directly with solder ball connect (SBC) technologies, or the like. These multichip modules include integrated circuit devices on at least one side of a passive substrate carrier, such as a dielectric material having wiring layers therein. The wiring layers in the substrate only provide the electrical interconnection required between the various chips disposed on either side of the substrate. Thus, it can be seen that conventional multichip modules are a plurality of integrated circuit devices wired together through a supporting passive substrate.

Thus, it can be seen that a multifunctional module in which the substrate layer, not only provides mechanical support and electrical interconnection for chips mounted thereon, but also provides an active functional layer would be highly desirable. This goal can be accomplished by using a silicon wafer including electronic components therein as the substrate carrier, and then mounting a plurality of integrated circuit devices on either side thereof.

It is known to use silicon wafers as substrate material, particularly to solve the problem of matching the thermal coefficient of expansion between the substrate and the chips. U.S. Pat. No. 5,039,628 describes a multichip module wherein a silicon material can be used as a carrier for integrated circuit devices. A preferred carrier material will have a thermal coefficient of expansion to match the mounted chips. It is also noted that vias are formed through the carrier material. U.S. Pat. No. 4,956,695 is a three dimensional chip package wherein plural ICs, having interconnection leads extending therefrom, are bonded with dielectric material. Ceramic spacers are placed intermediate of the leads and the ends of the spacers are then ground down to expose the interconnection leads. Ceramic spacers are used to match the thermal coefficient of expansion of the chips.

Other conventional systems use silicon as a carrier for integrated circuit devices and form vias in the silicon to allow connection through the carrier. For example, U.S. Pat. No. 3,787,252 is a semiconductor wafer having circuit elements formed on an epitaxial layer. Through connections are formed through the wafer to allow the circuit elements to contact interconnection points for conductors disposed on an adjacent insulating board. U.S. Pat. No. 5,024,966 discusses a silicon substrate used to mount a semiconductor optical device. An external modulated current source is then interconnected to the optical device. The silicon substrate includes a metallized via to allow connection of the optical device to a conducting layer disposed on the opposite side of the substrate. U.S. Pat. No. 5,063,177 describes packaging of monolithic microwave integrated circuits on a motherboard of high resistivity silicon. The silicon substrate acts as a transmission medium, chip carrier and heat conductor. Vias can be etched into the substrate to allow interconnection of the placed integrated circuits with a ground plane, or the like. Additionally, resistors, capacitors, and transmission lines can be integrated in the substrate, along with logic devices, such as microprocessors. The circuit elements are then mounted on a medium that can be diced to form individual integrated circuit devices. IBM Technical Disclosure Bulletin, volume 18, No. 10, March 1976, page 3478, shows a technique for bonding silicon substrates containing through holes. This technique is used in multiple chip (wafer) stacked packages.

It can be seen that none of the conventional systems use a multilayer silicon multichip module to form a multiprocessor functional element.

SUMMARY OF THE INVENTION

In contrast to the prior art, the present invention exploits the technology which allows conductive vias to be formed in a silicon substrate in order to fabricate a three dimensional multifunctional substrate.

Broadly, a silicon or other semiconductor carrier having embedded active devices therein is used as a substrate for complex functional elements disposed on both sides thereof. Thus, a three-dimensional complex module can be fabricated wherein the substrate also contains active circuit elements.

The semiconductor substrate includes conductive vias formed therein which interconnect the functional components, such as multichip modules disposed on either side thereof. Laser drilling and associated plating techniques allow for vias to be placed through a substrate containing active circuit devices. Using these drilling/plating techniques electrically interconnected devices can then be placed on opposite sides of the substrate. Multichip modules (MCM) including the desired functions are then fabricated having input/output (I/Os) connection points which correspond to the vias formed in the substrate. This interconnection between the MCMs and the substrate may be accomplished by providing circuitized lines and connection pads on dielectric layers, with conductive vias therein, which is subsequently placed on the active substrate. In this manner a three dimensional functional element can be fabricated which has the advantage of placing integrated circuit devices extremely close to one another, thereby reducing the length of data and address lines and the skew therebetween which enhances system performance.

At least one dielectric layer including circuitized lines can then be extended outwardly from the module in order to provide electrical connection to input output devices, i.e. keyboard, display, or the like, as well as other system components, such as other functional system entities (other 3D functional elements).

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
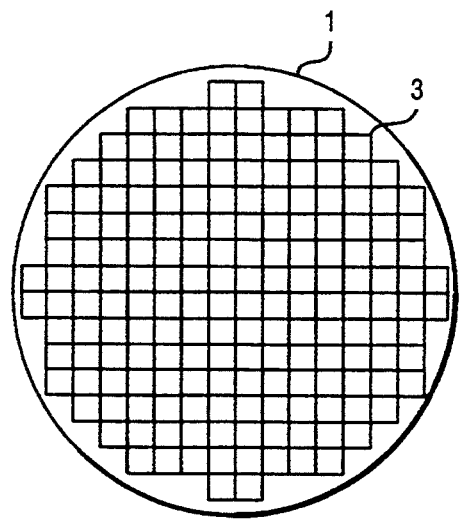
FIG. 1 is a plan view of a silicon wafer having active deuces therein, used as a substrate carrier in the three dimensional functional module of the present invention.

Referring to FIG. 1, a silicon wafer 1 is shown having a plurality of integrated devices free therein. It is well known in the art to fabricate wafers 1 having devices therein such as memory chips, logic chips, processors, and the like. However, conventional technology will dice wafer 1 into a plurality of individual devices 3 for placement into discrete packages, and then onto a passive substrate, or other carrier, such as an FR4 substrate for use as a computer planar board, adapter card, or the like. However, in accordance with the present invention, wafer 1 is not diced but used, wholly or in part, as an active substrate wherein functional components are attached on each side of wafer 1 to create a three tier functional module.

Figure 2:
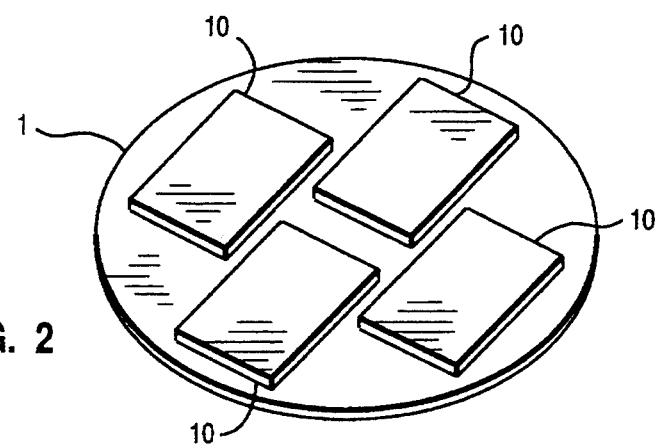
FIG. 2 is a perspective view of the wafer of FIG. 1 having a plurality of functional elements which may include modules with multiple individual chips mounted thereon, or plural individual chips.

FIG. 2 shows wafer 1 having a plurality of functional units 10 disposed thereon. These functional units 10 can vary in complexity from single chips to multichip modules (MCMs) having I/Os which are aligned and affixed to the I/Os of devices 3 on wafer 1. It should be understood that the scope of the present invention will include individually mounted single integrated circuit devices (chips or ICs) mounted to wafer 1 in place of, or in conjunction with the MCMs.

Figure 3:
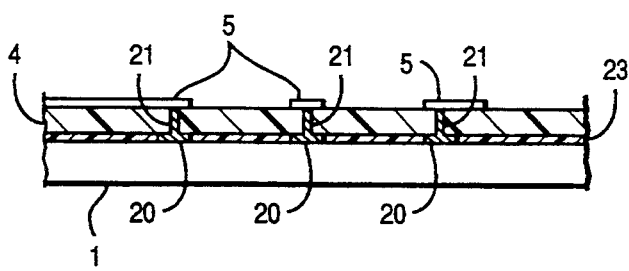
FIG. 3 is a cross sectional view of a wafer having additional wiring layers thereon to facilitate interconnection with a multichip module, or chip to be placed thereon.

FIG. 3 is a cross-sectional view of wafer 1 having a dielectric 4 disposed on one side thereof. An intermediate dielectric layer 23 is disposed between dielectric layer 4 and wafer 1. Layer 4 consists of any suitable dielectric material, such as polyimide, or the like. Vias 21 are formed therein to electrically connect I/O point 20 on the circuit devices embedded in wafer 1 with interconnection pads and circuitized lines 5 disposed on the top side of the dielectric layer 4. Those skilled in the art will understand how vias 21 and circuit lines 5 can be formed in, and on, layer 4 by processing the polyimide material with photo lithographic techniques, or the like. Conductive material is placed in vias 21 by using plating techniques or the like and circuitized lines 5 are formed on layer 4 using known methods. Thus, layer 4, vias 21 and circuitized lines and pads 5 allow discreet devices 3 embedded to be electrically interconnected with a chip, module or the like placed on layer 4 and in electrical connection circuitized pads and lines 5.

Figure 4:
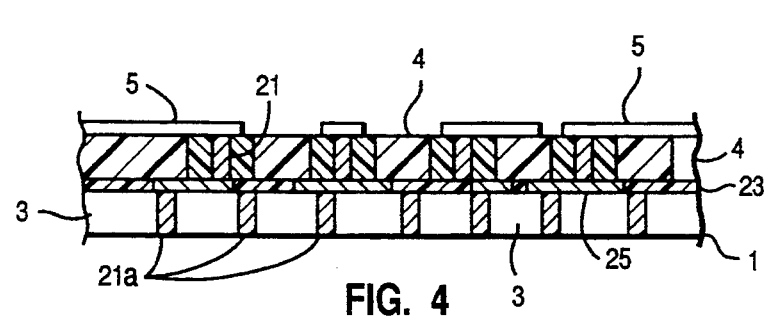
FIG. 4 is another cross sectional view of a wafer showing interconnecting vias therethrough.

FIG. 4 is a cross-sectional view of wafer 1 and dielectric layer 4, similar to that of FIG. 3. However, vias 21A are shown formed in wafer 1. These vias can be formed by a laser drilling/plating operation wherein vias on the order of 60 microns are formed in the wafer and can be located as close as 40 microns to active devices 3 contained therein. It is expected that the aforementioned dimensions will be reduced with technology advances, and are provided only as an example, not a limitation. Known plating techniques are employed to provide electrical connections through the wafer 1. It is important to maintain sufficient distance between the vias and the active devices 3, thus via placement is extremely critical. Other methods exist wherein electrical access can be provided through the wafer, such as diffusing a connection through the wafer as devices are formed, or connecting wires through a laser drilled hole in order to provide electrical interconnection between metallization on both sides of the wafer. In any event, connecting vias 21A are formed in wafer 1 such that interconnection can be made between functional units disposed on either side of the wafer (see FIG. 9). FIG. 4 also shows an intermediate dielectric layer 23, which can be placed on the wafer during fabrication, having circuitized lines 25 therein which interconnect vias 21 and vias 21A such that when a chip, module, or the like is disposed on layer 4, interconnection can be made from the chip I/Os through the wafer 1. Of course, those skilled in the art will comprehend how additional dielectric layers may be placed, or deposited, on layer 4 to form a multi-dielectric layered structure that will increase wireability of the entire multifunctional element of the present invention.

Figure 5:
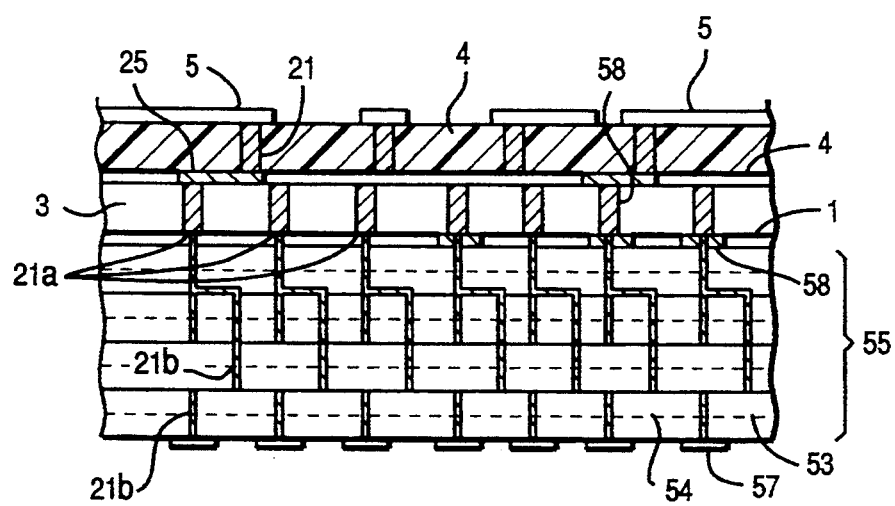
FIG. 5 shows wiring distribution layers on both sides of the wafer substrate which are used to interconnect the MCMs, or chips to the substrate.

Referring to FIG. 5, the structure of FIG. 4 is shown with multiple layer distribution substrate 55 attached to wafer 1 on a side opposite of dielectric layer 4. Distribution layer 55 is fabricated using processes common in the multichip module industry, wherein layers are built up to provide sufficient wiring to connect various devices. These processes include costing dielectric material onto the structure and then exposing the desired material through a photomask and removing the unexposed material by washing, or the like. The dielectric material can also be disposed on the structure by screening the material on such that it is only placed at desired locations. Circuitry and vias, can then be formed on the dielectric layer by techniques such as plating, or the like. The wiring layers must provide electrical connections between various ones of chip I/Os to be disposed on the MCM. Distribution layer 55 includes a plurality of individual dielectric layers 53 each having a conductive plane 54 therein of copper, aluminum, or the like. Connection vias 21B are shown within individual layers 53 and provide connection from pads 57 disposed on the outside of distribution layer 55 through the layer 55 and to circuitized lines and pads 58 disposed on the outside surface of wafer 1 and in electrical communication with vias 21A therethrough. In this manner, integrated circuit devices for modules disposed on dielectric layer 4 can be electrically connected with a module or chip disposed on the outside of distribution layer 55 using pads 57, vias 21B, pads 58, vias 21A, pads 25, vias 21 and pads and circuitized lines 5.

Figure 6:
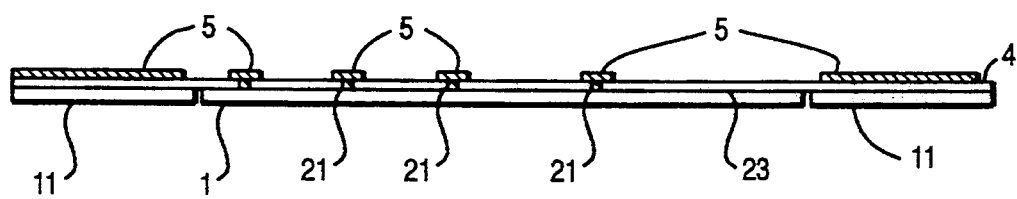
FIG. 6 illustrates the top side of the wafer substrate wherein the I/Os for the active devices are brought out to external interconnection pads.

FIG. 6 is a cross-sectional view showing the structure of FIG. 3, however, it can be seen that dielectric layer 4 has been extended outwardly past the edge of wafer 1. A removable base portion 11 is provided co-planar to wafer 1 and adjacent dielectric layer 4. This base portion is used during manufacturing of the present invention to support dielectric layer 4 upon completion of processing. Base portions 11 are subsequently removed such that dielectric layer 4 extends outwardly past wafer 1 forming a flexible cable which allows interconnection to remote components, such as other functional units peripheral devices or the like. Remaining elements of FIG. 6 are identical to those described in conjunction with the same reference numeral, described previously with respect to FIGS. 1-5.

Figure 7:
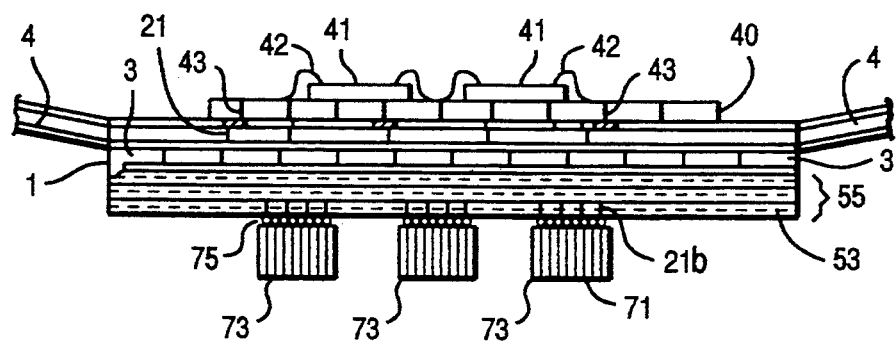
FIG. 7 shows a cross sectional area of the entire three dimensional functional module of the present invention including the necessary wiring layers needed to interconnect the I/Os of the active devices therein.

FIG. 7 shows the structure of FIG. 5 with multichip modules added to each side thereof. Electrical layer 40 includes chips 41 attached thereto and any electrical connection to layer 4 through vias 43. Chips 41 are wire bond type chips wherein leads 42 are used to interconnect the I/Os of the chip 41 to pads on the surface of substrate 40. These pads are electrically connected to vias 43 which then interconnect with pads (not shown) on the underside of layer 40 which are electrically connected to pads and circuitized lines 5 of dielectric layer 4. In this manner, the chip input/output connection points are electrically connected to the structure as previously discussed. Additionally, it can be seen from FIG. 7 that dielectric layer 4 extends outwardly from the three layer active functional unit of the present invention and can be utilized to connect this functional unit with other devices.

Plural integrated circuit devices 73 are shown adjacently attached to one another to form a cube 71. In a preferred embodiment, chip 73 will be memory chips, such as dynamic random access memory devices with the interconnection points brought out to an edge of the chip. Chip 73 are then glued or otherwise bonded to each other to form cube 71. Control collapse chip connection solder ball 75 are then placed along the edge having the I/O connection points such that memory cube 71 then can be electrically interconnected to the functional unit by pads 57 (not shown) in conjunction with vias 21B. In this manner, a multilayer functional unit can be fabricated wherein three layers of distinct active elements are disposed on a single three dimensional module. In a preferred embodiment, chips 41 would be processors and devices 3 crosspoint switches such that a multifunctional (e.g. multiprocessor) module is formed. In this module, multiple processors 41 are tightly coupled to memory subsystem such that any of the processors can access any memory location, subject only to arbitration requirements. Further, it can be seen from viewing the functional unit of FIG. 7, that line links between the processors and memory will be minimized, and hence any timing skew associated with differences in line lengths will also be minimized. This three-dimensional approach minimizes both line length and any mismatch of line length for these critical networks.

Figure 8:
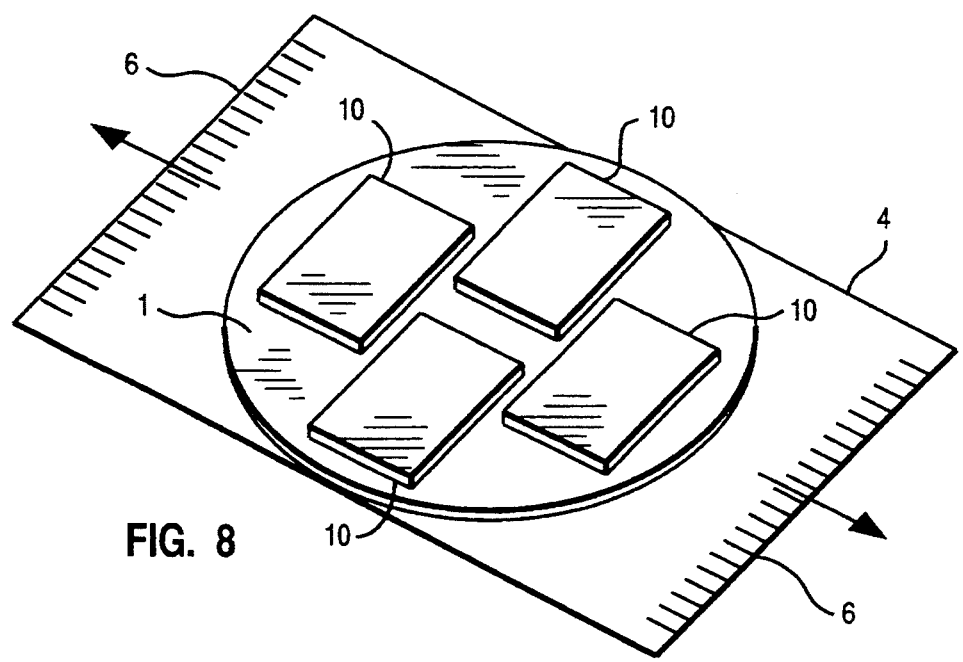
FIG. 8 is a perspective view of the top side of the functional module of the present invention showing an interconnection layer extending outwardly to provide electrical connection with system components.

FIG. 8 is a perspective diagram showing the wafer 1 and modules 10 of FIG. 2 with the addition of dielectric layer 4 extending therefrom. Interconnection means 6 is shown on each end of dielectric layer 4 such that electrical interconnection can be made between the functional unit of FIG. 8 and other components. For example, a compression type of connector may receive interconnection means 6 such that the functional unit of the present invention can be electrically interconnected with another such functional unit to provide additional processing units. The functional unit of the present invention can also be interconnected to peripheral devices such as a keyboard, graphics display, or the like in order to provide a stand alone computer processing system.

Figure 9:
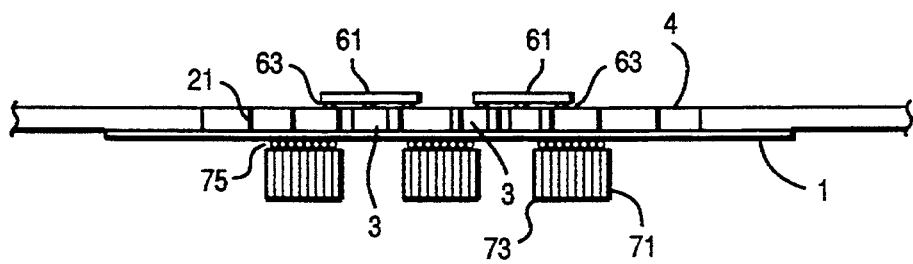
FIG. 9 is a cross sectional view of the module of the present invention with controlled collapse chip connect (C4) or solder ball connect (SBC) type chips or MCMs attached to the wafer substrate.

FIG. 9 shows another embodiment of the present invention wherein memory cubes 71 are directly attached to wafer 1 using C4 technology as described above with regard to FIG. 7. C4 type chip 61 are shown directly attached to the metallization on dielectric layer 4, i.e. the circuitized lines 5 along with corresponding interconnection pads, through solder balls 63. Dielectric layer 4 shown extending beyond the periphery of wafer 1 such that interconnection can be made to other components or devices. C4 chip 61 can communicate with embedded devices 3 (not shown) in wafer 1 and memory chip 73 through solder 63, circuitized lines on the surface of dielectric layer 4, vias 21 and vias with wafer 1, and solder ball 75 of memory cube 71.

Figure 10:
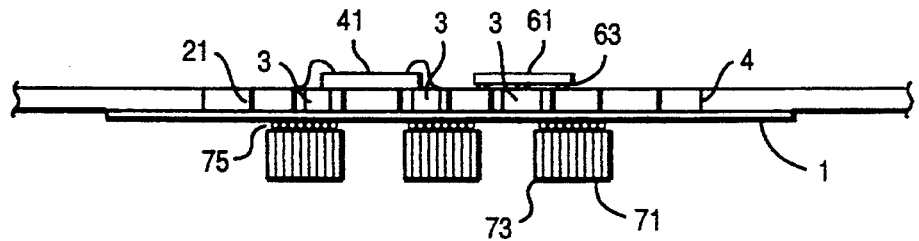
FIG. 10 is another cross sectional view of the present invention showing mixed technology chips, e.g. wire bonded and C4, attached to the wafer substrate.

FIG. 10, shows another packaging embodiment wherein a C4 technology chip 61 and a wire bonded chip 41 are disposed on dielectric layer 4 and electrically interconnected to memory chip 73 of cube 71 disposed on the opposite side of wafer 1. Thus, it can be seen how FIG. 7 shows wire bonded chips 41, FIG. 9 illustrates C4 technology 61 and FIG. 10 is a functional unit containing mixed technology chips 41 and 61. Of course, other connection schemes are contemplated by the present invention such as surface mount technology, tape automated bonding, and the like. Additionally, it can be understood how different functions can be placed on the same side of the wafer. For example, in FIG. 10, chip 41 could represent a central processing unit, with chip 61 a memory chip. In this manner, the CPU (chip 41) and level 1 cache (chip 61) could be located on the same side of the wafer 1 with system memory, e.g. cube 71 disposed on the opposite of the wafer. Thus, those skilled in the art will understand how a virtually unlimited combination of functions can be packaged using wafer 1, with its active devices therein, as the substrate carrier for the mulifunctional module.

Furthermore, in a preferred embodiment of the present invention, the embedded devices 3 in wafer 1 will be interconnected with the circuit devices (e.g. 41, 61, 71) on each side of the wafer through pads, circuitized lines, and the like as known in the art. However, the circuit devices on either side of wafer 1 will be interconnected with each other through vias 21a (FIG. 5).

Figure 11:
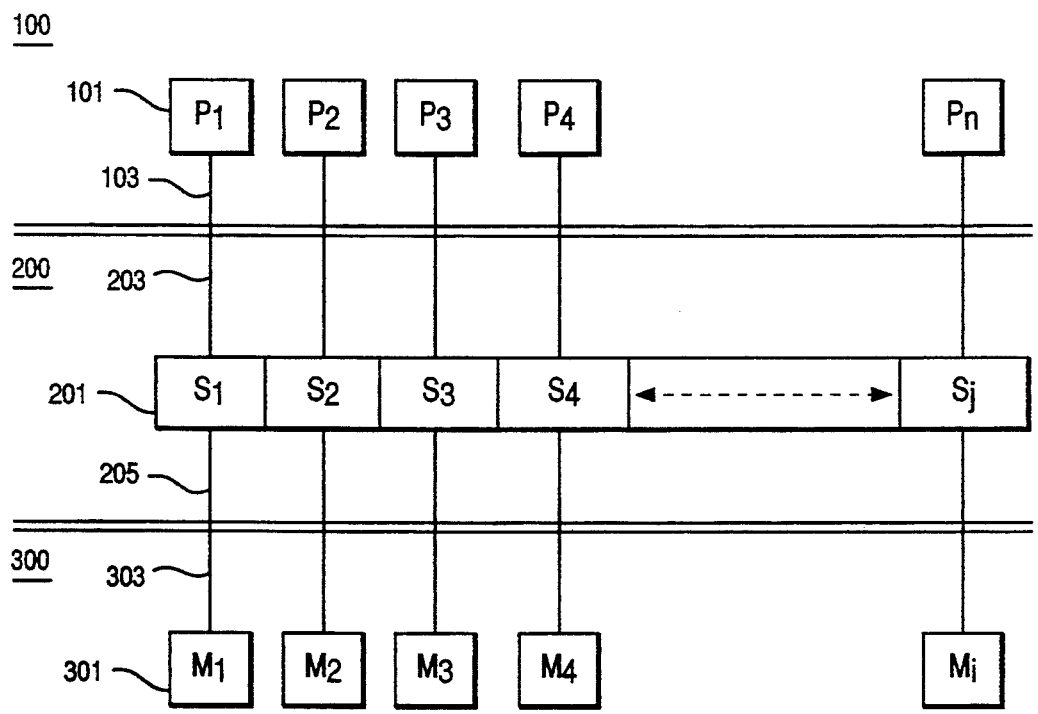
FIG. 11 is a cross sectional schematic representation of the multiple discrete functions provided by present invention.

FIG. 11 is a block diagram representing a schematic cross-section of a preferred embodiment of the functional unit of the present invention. Layer 100 represents a plurality of processors 101, P1 through PN for a multiprocessor embodiment. Processor 101 can be any one of a number of commercially available central processing unit such as the Intel X86 Series, as well as the RISC System/6000 processing units provided by the IBM Corporation. Processor leads 103 interconnect each of the processing units 101 with switches 201. Reference numeral 200 represents the second active layer including a plurality of crosspoint switches 201, S1 through SJ having interconnection leads 203 for transferring address and data between processors 101. Switches 201 are preferably commonly referred to as crosspoint switches which include a register for receiving a data request as well as an address for the location where the data resides, which may be in system memory or a data cache associated with another processor 101. Logic is provided to control a switch which allows the data to be retrieved from a memory location and provided through the switch back to the requesting processor 101. Another crosspoint switch I/O 205 interconnects the switches with devices in the third active layer 300. In a preferred embodiment, the third active layer 300 includes a plurality of memories 301, M1 through MI, which are used to store data. Input/output leads 303 interconnect the memories 301 to crosspoint switches I/O 205 such that addresses, data and data requests from processors 101 are provided to a corresponding memory 301 through switches 201. It can be seen, that the present invention provides three active layers in a single functional unit, as shown in FIGS. 7, 8 and 9, in contrast to conventional functional modules and multichip modules wherein a passive substrate or carrier is used to provide the required wiring for interconnection of a single layer of processing elements, or the like.

It should be understood that the multiprocessor embodiment of FIG. 11 is one of many configurations contemplating by the present invention. For example, a video adapter card including a layer of application specific integrated circuits (ASIC) video RAM and switches may be provided to form an adapter card.

Figure 12:
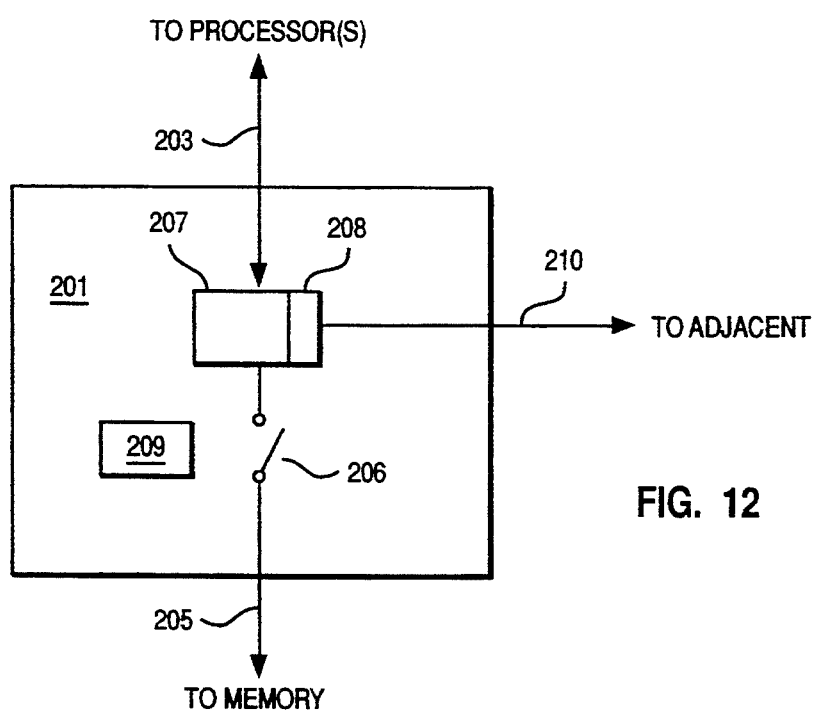
FIG. 12 is a schematic of a cross point switch utilized in a preferred embodiment of the present invention.

FIG. 12 is a schematic of the crosspoint switch 201 and shows input line 2037 interconnected with processors 101 by lead 103, which receives load and store instructions from the processors. A register 207 is provided which stores the load or store instructions from the processor 101. An address bit is stored in a register location 208 which corresponds to the memory address containing the data to be loaded or the memory where the data is to be stored. A switch 206 allows the instruction to be provided to memory 301 when closed. Switch logic 209 is used to control the operation of switch 206 such that the instruction in register 207 is provided to the memory via output 205 only when the memory is available for use, i.e. a corresponding processor has arbitrated for access to the memory. Additionally, line 210 is schematically shown which allows data to be transferred to an adjacent crosspoint switch such that any one of the processors 101 can send data between any of the memories 301, through switches 201. In this manner, processor P1 can send a store instruction, or the like, to switch S1 and this instruction can then be transferred to switch S4 and the data stored in memory 304. Thus, interconnection line 210 allows any of switches 201 to be interconnected with any one of the processors 101 and memories 301. For example, a data transfer request can be sent from register 207 in switch S2 to a register in switch S3 and on to memory M3, and is not limited to the corresponding memory as shown in FIG. 11, i.e. M2. Additionally, it will be understood how circuitized lines may be formed on each surface of wafer 1 (i.e. switches 201) to provide interconnection between each of switches 201 through leads 203, 205, as desired for a specific multifunctional module application.

Although certain preferred embodiments have been shown and described, it should be understood that many changes and modification can be made therein without departing from the scope of the appended claims.

We claim

1. A functional module for providing processing operations in a computer system, comprising:
   a semiconductor substrate having at least one active circuit device with exposed connection points embedded therein;
   at least one first circuit device including a central processing unit configured as at least one individual integrated circuit device disposed on a first side of said substrate and interconnected with said at least one embedded circuit device;
   at least one second circuit device including at least one memory device disposed on a second side of said substrate, and interconnected to said at least one embedded circuit device and said at least one first circuit device;
   a plurality of conductive vias extending through said semiconductor substrate to interconnect said at least one first circuit device and said at least one second circuit device; and
   at least one wiring layer flexibly extending from said nodule and including interconnection means for interconnecting said functional module with another functional module and an input/output device, said at least one wiring layer being adjacent said substrate for wiring one of said at least one first circuit device and said at least one second circuit device to said at least one embedded circuit device.

2. A module according to claim 1 wherein said semiconductor substrate is a wafer and said at least one embedded device is a cross point switch.

* * * * *